US010996274B2

United States Patent
De Giacomo et al.

(10) Patent No.: US 10,996,274 B2
(45) Date of Patent: May 4, 2021

(54) CONTROL CIRCUIT, AND METHOD FOR IMPROVING THE MEASURABILITY OF A MECHANICAL SWITCH-ON PROCESS OF AN ELECTROMAGNETIC ACTUATOR

(71) Applicant: SCHAEFFLER TECHNOLOGIES AG & CO. KG, Herzogenaurach (DE)

(72) Inventors: Fabio De Giacomo, Roettenbach (DE); Weigang Wang, Nuremberg (DE); Piergiacomo Traversa, Nuremberg (DE)

(73) Assignee: SCHAEFFLER TECHNOLOGIES AG & CO. KG, Herzogenaurach (DE)

( * ) Notice: Subject to any disclaimer, the term of this patent is extended or adjusted under 35 U.S.C. 154(b) by 135 days.

(21) Appl. No.: 16/345,008

(22) PCT Filed: Oct. 18, 2017

(86) PCT No.: PCT/DE2017/100899
§ 371 (c)(1),
(2) Date: Apr. 25, 2019

(87) PCT Pub. No.: WO2018/077343
PCT Pub. Date: May 3, 2018

(65) Prior Publication Data
US 2019/0277914 A1    Sep. 12, 2019

(30) Foreign Application Priority Data
Oct. 27, 2016   (DE) .................... 10 2016 221 168.4

(51) Int. Cl.
*G01R 31/327*   (2006.01)
*H01F 7/06*    (2006.01)
*H01F 7/18*    (2006.01)
*H01F 27/24*   (2006.01)
*H01F 27/28*   (2006.01)

(52) U.S. Cl.
CPC ......... *G01R 31/3278* (2013.01); *H01F 7/064* (2013.01); *H01F 7/1883* (2013.01);
(Continued)

(58) Field of Classification Search
CPC .............. G01R 31/3278; G01R 19/175; G01R 31/085; H01F 38/14; H01F 7/064;
(Continued)

(56) References Cited

U.S. PATENT DOCUMENTS 3,946,285 A    3/1976  Beery et al.
2002/0149331 A1*  10/2002  Marcinkiewicz .... B23K 20/121
                                                    318/254.1
(Continued)

FOREIGN PATENT DOCUMENTS

CN    104426422 A    3/2015
CN    104956565 A    9/2015
(Continued)

OTHER PUBLICATIONS

International Search Report for Application No. PCT/DE2017/100899, dated Feb. 1, 2018, 5 pages.

*Primary Examiner* — Melissa J Koval
*Assistant Examiner* — Trung Q Nguyen
(74) *Attorney, Agent, or Firm* — Brooks Kushman P.C.

(57) ABSTRACT

An electronic circuit configured to control an electromagnetic actuator with an electric coil, comprising at least one first electronic switching element, a capacitor, and a diode connected to the first electronic switching element, the capacitor, and the electrical coil to form a step-up converter, wherein the capacitor is configured to be charged to a voltage that is greater than an operating voltage of the electronic circuit.

17 Claims, 5 Drawing Sheets

(52) U.S. Cl.
CPC .............. *H01F 27/24* (2013.01); *H01F 27/28* (2013.01); *H01F 2007/1822* (2013.01)

(58) Field of Classification Search
CPC ........ H01F 7/1883; H01F 27/24; H01F 27/28; H01F 2007/1822; H01F 7/06; F01L 25/08; F02D 41/24
USPC ........ 324/500, 536, 546–548, 425–427, 160, 324/180, 76.11, 104, 108, 200, 253, 127
See application file for complete search history.

(56) References Cited

U.S. PATENT DOCUMENTS

| | | | |
|---|---|---|---|
| 2003/0140899 A1 | 7/2003 | Bolz | |
| 2005/0146408 A1 | 7/2005 | Traversa et al. | |
| 2011/0163769 A1 | 7/2011 | Herrera et al. | |
| 2015/0061461 A1* | 3/2015 | Schrod | F02D 41/2096 |
| | | | 310/316.03 |
| 2016/0102779 A1 | 4/2016 | Lang et al. | |
| 2016/0111237 A1 | 4/2016 | Mayer-Dick | |

FOREIGN PATENT DOCUMENTS

| | | |
|---|---|---|
| CN | 105655088 A | 6/2016 |
| CN | 105723492 A | 6/2016 |
| DE | 10202279 A1 | 8/2003 |
| DE | 102013201134 A1 | 7/2014 |
| DE | 102013213329 A1 | 1/2015 |
| DE | 102014200184 A1 | 7/2015 |
| DE | 102014220795 A1 | 4/2016 |
| DE | 102014220929 A1 | 4/2016 |
| EP | 0091648 A1 | 10/1983 |

\* cited by examiner

CONTROL CIRCUIT, AND METHOD FOR IMPROVING THE MEASURABILITY OF A MECHANICAL SWITCH-ON PROCESS OF AN ELECTROMAGNETIC ACTUATOR

CROSS-REFERENCE TO RELATED APPLICATIONS

This application is the U.S. National Phase of PCT/DE2017/100899 filed Oct. 18, 2017, which claims priority to 102016221168.4 filed Oct. 27, 2016, the entire disclosures of which are incorporated by reference herein.

TECHNICAL FIELD

The present disclosure relates firstly to a method for improving the measurability of an end time of a mechanical switch-on operation of an electromagnetic actuator. The electromagnetic actuator may be a switching valve, for example. The disclosure further relates to an electronic control circuit for controlling an electromagnetic actuator, the electronic control circuit allowing improved measurability of an end time of a mechanical switch-on operation of the electromagnetic actuator.

BACKGROUND

US 2011/0163769 A1 discloses a method for recognizing at least one mid-stroke position of a load driven by an active material element. The material element experiences a change in load in this mid-stroke position.

A method for recognizing the reaching of a closed position of an electromagnetic switching valve is known from US 2005/0146408 A1, in which the current flowing after deactivating the switching valve is evaluated.

DE 10 2013 213 329 A1 teaches a method for recognizing the mode of operation of a switching valve, comprising a magnetic core that extends in a coil, and a valve body that is moved in the axial direction by the magnetic core and the energized coil.

DE 10 2014 220 929 A1 discloses a method for controlling an inductive actuator. In this method, a fairly large voltage is applied to an actuator coil when an actuating element begins to move. The voltage is selected as a function of the speed of the actuating element to be achieved.

DE 10 2013 201 134 A1 describes a method for operating a solenoid valve, in which the change over time of a current for energizing the solenoid valve is analyzed during an energizing phase.

EP 0 091 648 A1 discloses an excitation circuit for pulse-excited solenoid valves, including a timer that is formed from a transistor, a capacitor, and a resistor.

A method and a circuit arrangement for controlling injection valves are known from DE 10 2014 200 184 A1. According to the method, time clocking of a supply voltage is carried out until the injection valve is totally open or closed. The circuit arrangement includes an RC element that acts as a low-pass filter.

DE 10 2014 220 795 A1 teaches a method for specifying a current flowing through a solenoid of a solenoid valve. A closing time of the solenoid valve is detected with a sensor. The current through the solenoid is increased when premature closing of the solenoid valve is recognized.

SUMMARY

An object of the present disclosure is to improve the measurability of an end time of a mechanical switch-on operation of an electromagnetic actuator.

The stated object is achieved by a method and control circuit according to the disclosure below.

The method according to the disclosure is used to improve the measurability of an end time of a mechanical switch-on operation of an electromagnetic actuator. In this regard, the method forms a portion of a method for operating or for controlling the electromagnetic actuator. The electromagnetic actuator may be a switching valve that is used, for example, in an automobile, in a chemical plant, in an energy plant, in a machine, or in a medical installation. The switching valve may in particular be designed for an internal combustion engine of a motor vehicle. The switching valve may be designed for hydraulically controlling an intake valve of an internal combustion engine of a motor vehicle. However, the electromagnetic actuator may also be a solenoid, for example.

The electromagnetic actuator includes an electromagnetic core in the form of an iron core, and an electrical coil in the interior of which the iron core may be situated. The iron core is displaceable by energizing the electrical coil, so that electrical energy is converted into mechanical energy, and the electromagnetic actuator drives the element which it is to move. The iron core may be displaceable in the electrical coil in the axial direction of the electrical coil. An actuator element that is moved by the iron core is situated on the iron core. The actuator element may be a valve body when the actuator is formed by a switching valve. The iron core may be made of iron or some other ferromagnetic material.

The coil may be energized in order to displace the iron core, for which purpose a coil voltage may be applied to the electrical coil by an electronic control circuit, thus producing a coil current in the coil. The control circuit is thus used for operating the electromagnetic actuator.

During the mechanical switch-on operation, the iron core is moved from a starting position into an end position. The iron core remains in the end position as long as the actuator is mechanically switched, i.e., as long as the coil voltage is applied. When the coil voltage is switched off, this results in a mechanical switch-off operation. During the mechanical switch-off operation, the iron core is moved back from the end position into the starting position, for which purpose the iron core is driven by a return spring, for example. The end time of the mechanical switch-on operation, which is measurable in an improved manner by the method according to the disclosure, is achieved when the iron core has reached its end position.

The electronic control circuit is supplied with an operating voltage, which results in feeding of the electromagnetic actuator.

In one step of the method according to the disclosure, a capacitor situated in the electronic control circuit is charged. The energy for charging the capacitor is withdrawn from the operating voltage. The capacitor may be charged to a capacitor voltage that is greater than the operating voltage. For this purpose, a step-up converter may be used whose inductance is formed by the coil of the actuator, and whose capacitance is formed by the capacitor to be charged.

In another step of the method according to the disclosure, the capacitor is discharged in order to increase the coil voltage during the mechanical switch-on operation to a value that is greater than the operating voltage. This increase in the coil voltage in particular results in a significant shortening of a current rise phase, while there may be only slight shortening during the mechanical switch-on operation. The shortened current rise phase allows a more accurate evaluation of the current pattern after the current rise phase when the mechanical switch-on operation is completed. The change in the coil current over time is determined in order to determine the end time of the mechanical switch-on operation. The duration of the mechanical switch-on operation may also be deduced from the measured end time of the mechanical switch-on operation.

In one embodiment of the method according to the disclosure, during the mechanical switch-on operation the coil voltage is increased up to the measured end time of the mechanical switch-on operation. The discharging of the capacitor thus does not occur after the measured end time.

In embodiments of the method according to the disclosure, the coil voltage is increased beginning with the mechanical switch-on operation. As a result, the discharging of the capacitor begins with the start of the mechanical switch-on operation. The mechanical switch-on operation begins when the coil voltage is applied to the coil.

In embodiments of the method according to the disclosure, during the mechanical switch-on operation the value of the coil voltage is at least one and a half times greater than the operating voltage. In further embodiments of the method according to the disclosure, the value of the coil voltage during the mechanical switch-on operation is at least three times greater than the operating voltage. The value of the coil voltage during the mechanical switch-on operation may be up to five times or more than five times greater than the operating voltage.

In embodiments of the method according to the disclosure, the capacitor voltage of the charged capacitor is at least one and a half times greater than the operating voltage. In further embodiments of the method according to the disclosure, the capacitor voltage of the charged capacitor is at least three times greater than the operating voltage. The capacitor voltage of the charged capacitor may be up to five times or more than five times greater than the operating voltage.

The method according to the disclosure is particularly suitable for applications in which the operating voltage is fixed and cannot be increased. This is the case in particular for mobile applications, for example in a motor vehicle, where the operating voltage is tapped by a battery. The operating voltage may be provided by a battery voltage. The battery is used for feeding the control circuit, and thus, also for operating the actuator.

In embodiments of the method according to the disclosure, during the energization the coil current initially rises in the current rise phase. The current rise phase begins when the coil voltage is applied to the electrical coil. During the current rise phase, the coil current may rise from zero to a maximum current value. A small alternating current component may be superimposed on this rise in the coil current. Magnetic saturation of the electromagnetic actuator occurs when the maximum current value is reached.

The current rise phase may be followed by a peak current phase in which the coil current drops from a peak current phase initial value, formed by the maximum current value, to a peak current phase intermediate value, and rises from the peak current phase intermediate value to a peak current phase end value. A small alternating current component may be superimposed on this drop and rise in the coil current. The peak current phase is followed by a holding current phase in which the coil current drops to a holding current value range and remains there.

In embodiments of the method according to the disclosure, the peak current phase is followed by a rundown phase, which in particular follows the holding current phase. The rundown phase starts when the coil voltage is switched off, i.e., the electromagnetic actuator is electrically switched off. During the rundown phase, the coil current drops from a rundown phase initial current value to zero and rises to a rundown phase intermediate current value, whereupon the coil current drops from the rundown phase intermediate current value to a rundown phase end current value. The rundown phase end current value may be zero.

The mechanical switch-on operation may extend into the peak current phase. The end time of the mechanical switch-on operation may be achieved when the peak current phase intermediate value is reached. The point in time when the peak current phase intermediate value is reached may be measured in order to use it as the end time of the mechanical switch-on operation.

The capacitor may be charged when the actuator is mechanically switched off and no coil voltage is applied to the coil. Alternatively or additionally, the capacitor may be charged at the start of the holding current phase, while the coil current is dropping to a holding current value range. Alternatively or additionally, the capacitor may be charged at the start of the rundown current phase, while the coil current is dropping from the rundown phase initial current value to zero.

In embodiments of the method according to the disclosure, the capacitor is charged by a charging current that is pulse width-modulated. Likewise, the capacitor is discharged by a discharging current that may be pulse width-modulated.

The electronic control circuit according to the disclosure is used for controlling an electromagnetic actuator. The electromagnetic actuator may be a switching valve. The electromagnetic actuator includes an electromagnetic core in the form of an iron core, and an electrical coil, in the interior of which the iron core may be situated. The iron core is displaceable by energizing the electrical coil. A coil voltage is to be applied to the electrical coil by the electronic control circuit in order to energize the coil by a coil current.

The electronic control circuit includes at least one first electronic switching element, a capacitor, and a diode that are connected in such a way that, together with the coil to be connected, they form a step-up converter. The capacitor may thus be charged to a voltage that is greater than an operating voltage of the electronic control circuit. The electronic control circuit according to the disclosure may include a second switching element for electrically switching the coil, to be connected, to the capacitor, so that the charged capacitor is dischargeable via the coil, and the coil voltage may be increased to a value that is greater than the operating voltage.

The first switching element may be formed by a transistor, which may be by a MOSFET.

The electronic control circuit may include a half-bridge circuit with an upper MOSFET and a lower MOSFET. The lower MOSFET may form the first switching element of the step-up converter.

The diode may be formed by a Schottky diode. The capacitor may be formed by an electrolytic capacitor.

The half-bridge circuit may also include an electronic free-wheeling element that may be connected to the upper MOSFET. The free-wheeling element may be formed by a MOSFET or by a Schottky diode.

The second switching element forms a step-up switching element, since it may be used for electrically connecting the coil, to be connected, to the capacitor. The second switching element may be formed by a MOSFET.

The electronic control circuit according to the disclosure may be designed for controlling or for operating multiple electromagnetic actuators. For this purpose, the electronic control circuit includes multiple individual controls, one for each of the multiple electromagnetic actuators. Each of the individual controls includes one of the first switching elements and one of the diodes. The capacitor is available for the overall electronic control circuit, i.e., for each of the individual controls. The first switching element and the diode of each of the individual controls and the one capacitor of the overall electronic control circuit are connected in such a way that, together with the coil to be connected to the respective individual control, they form a step-up converter. In addition to the capacitor, the second switching element may also be available for the overall electronic control circuit. The one second switching element is connected in such a way that it is designed for electrically switching each of the coils, to be connected, to the capacitor, so that the charged capacitor is dischargeable via the respective coil.

The control circuit according to the disclosure may be configured for carrying out the method according to the disclosure. The control circuit according to the disclosure may be configured for carrying out embodiments of the method according to the disclosure. In addition, the control circuit according to the disclosure may also have features that are provided in conjunction with the method according to the disclosure and its embodiments.

BRIEF DESCRIPTION OF THE DRAWINGS

Further particulars, advantages, and refinements of the disclosure result from the following description of embodiments of the disclosure, with reference to the drawings, which show the following.

DETAILED DESCRIPTION

Figure 1:
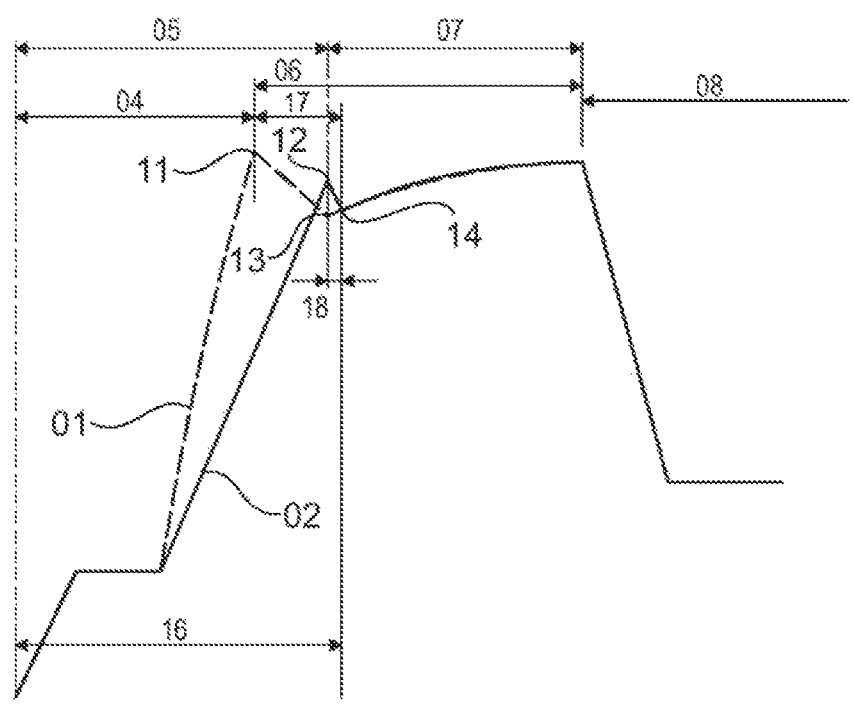
FIG. 1 shows a time curve of a coil current as the result of carrying out a method according to the disclosure, compared to the prior art.

FIG. 1 shows a time curve of a coil current 01 as the result of carrying out one embodiment of a method according to the disclosure, compared to a time curve of a coil current 02 according to the prior art. The coil current 01 flows in an electrical coil 03 (shown in FIG. 3) of an electromagnetic actuator (not shown) in which an iron core (not shown) is moved. The electromagnetic actuator is in particular a switching valve.

After a coil voltage is applied to the coil 03 (shown in FIG. 3) during a current rise phase 04, 05, the coil current 01, 02 rises and passes through a peak current phase 06, 07, whereupon it remains in a holding current phase 08 until the action by the coil voltage has ended. After the action by the coil voltage, this is followed by a rundown current phase 09 (shown in FIG. 2).

According to the disclosure, the coil voltage in the current rise phase 04 is increased to a value that is higher than an operating voltage, so that a peak current phase initial value 11 of the coil current 01 is reached earlier than a peak current phase initial value 12 of the coil current 02 according to the prior art. In the peak current phase 06, the coil current 01 subsequently drops to a peak current phase intermediate value 13. In the same way, according to the prior art the coil current 02 drops to a peak current phase intermediate value 14. When the peak current phase intermediate value 13, 14 is reached, a mechanical switch-on period 16 is concluded, since a mechanical switch-on operation of the actuator (not shown) has ended and the actuator is in a switched state. The peak current phase intermediate value 13 achieved according to the disclosure is only slightly chronologically before the peak current phase intermediate value 14 achieved according to the prior art, so that the mechanical switch-on period 16 changes very little due to the disclosure. However, the peak current phase initial value 11 achieved according to the disclosure is significantly chronologically before the peak current phase initial value 12 achieved according to the prior art. A detection time 17 achieved according to the disclosure for recognizing the peak current phase intermediate value 13 is thus much longer than a detection time 18 achieved according to the prior art for recognizing the peak current phase intermediate value 14. The much longer detection time 17 allows an improved determination of the time when the peak current phase intermediate value 13 is reached, so that the mechanical switch-on period 16 may be determined more accurately. The detection time 18 achieved according to the prior art for recognizing the peak current phase intermediate value 14 is very short, and results in great inaccuracy in determining the time when the peak current phase intermediate value 14 is reached, so that the mechanical switch-on period 16 is correspondingly measured inaccurately.

The point in time of the peak current phase intermediate value 13 thus represents an end time of the mechanical switch-on period 16.

Figure 2:
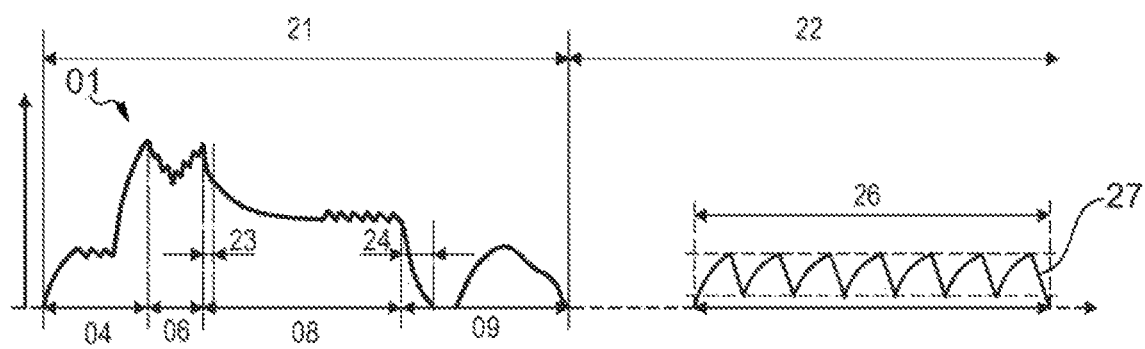
FIG. 2 shows a charging operation to be carried out according to the disclosure.
Figure 3:
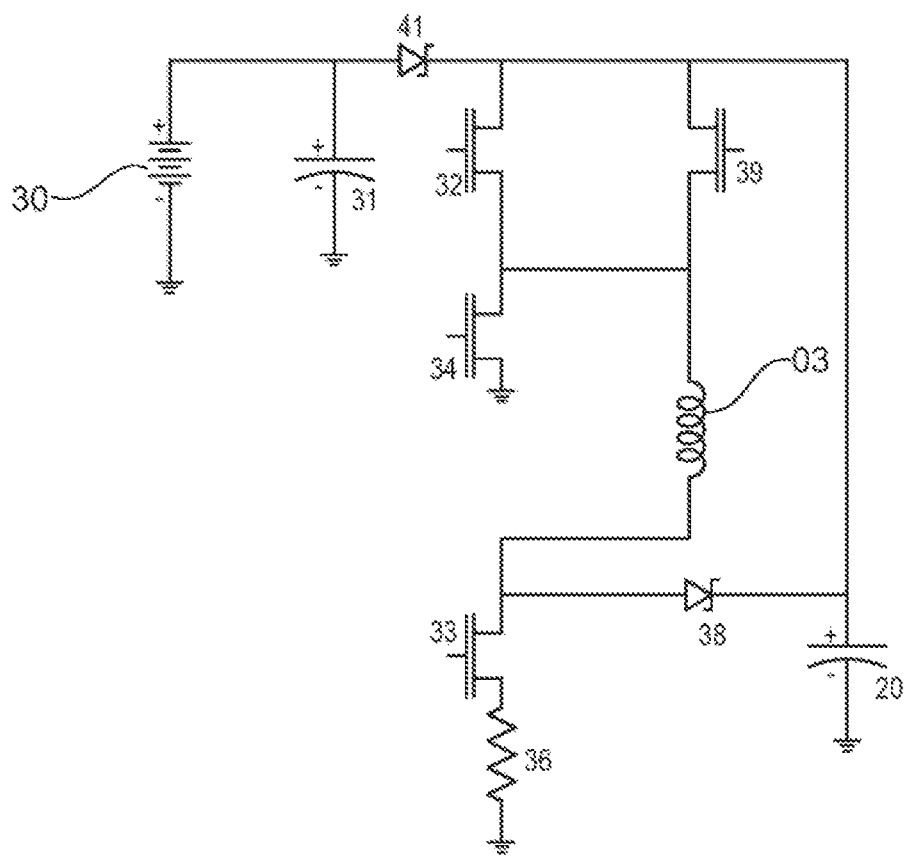
FIG. 3 shows a circuit diagram of one embodiment of one control circuit according to the disclosure.

The increase in the coil voltage according to the disclosure in the current rise phase 03 to a value that is greater than the operating voltage takes place by discharging a capacitor 20 (shown in FIG. 3). The charging of the capacitor 20 is explained in greater detail with reference to FIG. 2.

FIG. 2 shows chronological phases of a charging operation, may be carried out according to the disclosure, for charging the capacitor 20 (shown in FIG. 3). The change in the coil current 01 over time is first illustrated, as in FIG. 1. Illustrated in particular are the current rise phase 04, the peak current phase 06, the holding current phase 08, and the rundown current phase 09, which are in a switching phase 21 in which the actuator (not shown) is mechanically switched on, held, and switched off. The switching phase 21 is followed by a resting phase 22 as soon as the switching off of the actuator has concluded and the coil current 01 remains unchanged at zero.

A first charging phase 23, a second charging phase 24, and a third charging phase 26 are illustrated, which may be alternatively or jointly used in order to charge the capacitor 20 (shown in FIG. 3) according to the disclosure. The first charging phase 23 is present at the start of the holding current phase 08, while the coil current 01 is dropping. The second charging phase 24 is present at the start of the rundown current phase 09, while the coil current 01 is dropping to zero. The third charging phase 26 is present in the resting phase 22. A change in a charging current 27 over time for charging the capacitor 20 (shown in FIG. 3) is illustrated in the third charging phase 26. The charging current 27 is pulse width-modulated.

FIG. 3 shows a circuit diagram of one embodiment of a control circuit according to the disclosure, which is designed for carrying out the method illustrated in FIGS. 1 and 2. The control circuit is supplied with power by a battery 30. A voltage of the battery thus represents the operating voltage. A backup capacitor 31 is connected in parallel to the battery 30. The control circuit, as is also known from the prior art, includes a half-bridge circuit with an upper MOSFET 32 and a lower MOSFET 33, as well as a freewheeling MOSFET 34. The lower MOSFET 33 is connected to ground via a shunt 36. According to the disclosure, the control circuit also includes a Schottky diode 38 and the capacitor 20 in the form of an electrolytic capacitor, which together with the lower MOSFET 33 and the coil 03 form a step-up converter, which may also be referred to as a DC-DC converter. The control circuit, in particular the lower MOSFET 33, is controlled in such a way that a capacitor voltage at the capacitor 20 is at least one and a half times greater than the battery voltage.

The control circuit also includes a step-up MOSFET 39, via which the capacitor voltage of the capacitor 20, which is greater than the battery voltage, may be switched to the coil 03.

Since the capacitor voltage of the capacitor 20 is greater than the battery voltage of the battery 30, the control circuit includes a further diode 41 in front of the battery 30.

Figure 4:
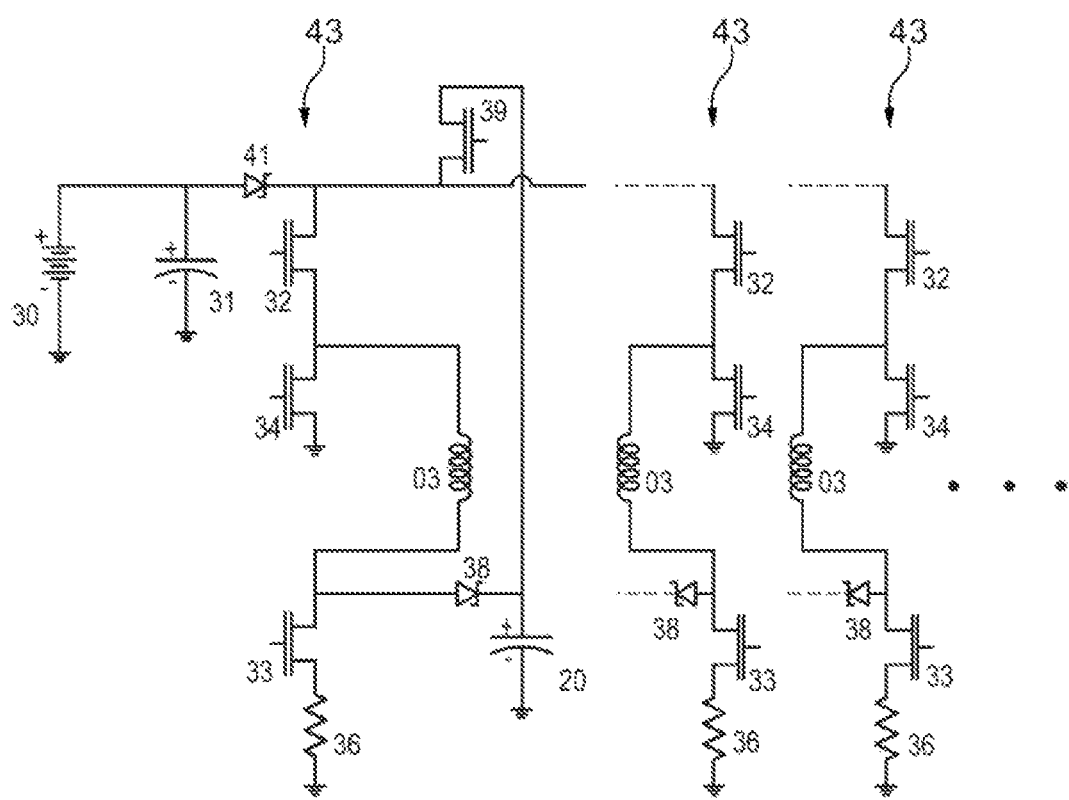
FIG. 4 shows a circuit diagram of another embodiment of the control circuit according to the disclosure.

FIG. 4 shows a circuit diagram of another embodiment of the control circuit according to the disclosure. This embodiment is designed for operating multiple electromagnetic actuators (not shown), so that multiple coils 03 are to be energized. For this purpose, the electronic control circuit includes multiple individual controls 43 for energizing in each case one of the coils 03 of the electromagnetic actuators (not shown). Each of the individual controls 43 includes the upper MOSFET 32, the lower MOSFET 33, the freewheeling MOSFET 34, the shunt 36, and the Schottky diode 38, the same as in the embodiment shown in FIG. 3. Only one capacitor 20 and one step-up MOSFET 39 are present, since they are used for all individual controls 43.

Figure 5:
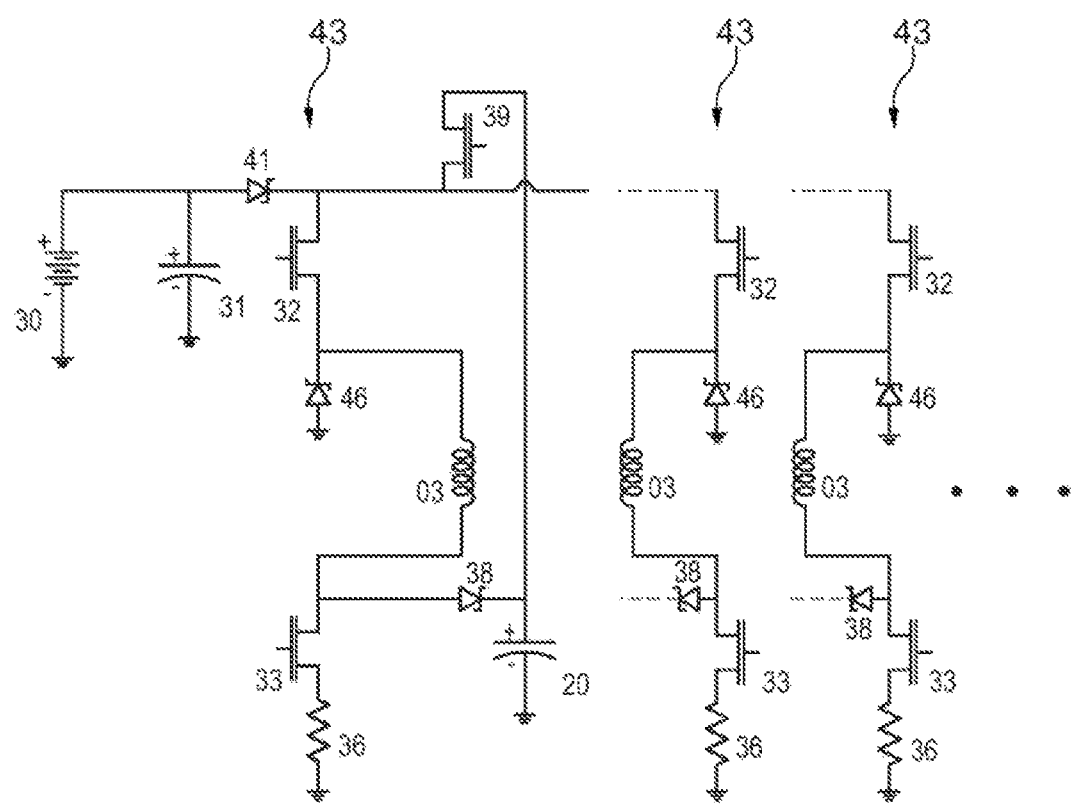
FIG. 5 shows a circuit diagram of a modified embodiment of the control circuit according to the disclosure.

FIG. 5 shows a circuit diagram of a modified embodiment of the control circuit according to the disclosure. This embodiment is modified with respect to the embodiment shown in FIG. 4, in that it has freewheeling Schottky diodes 46 instead of the freewheeling MOSFET 34.

LIST OF REFERENCE NUMERALS 01 coil current
02 coil current
03 electrical coil
04 current rise phase
05 current rise phase
06 peak current phase
07 peak current phase
08 holding current phase
09 rundown phase
10—
11 peak current phase initial value
12 peak current phase initial value
13 peak current phase intermediate value/end time of a switch-on operation
14 peak current phase intermediate value/end time of a switch-on operation
15—
16 mechanical switch-on period
17 detection time
18 detection time
19—
20 capacitor
21 switching phase
22 resting phase
23 first charging phase
24 second charging phase
25—
26 third charging phase
27 charging current
28—
29—
30 battery
31 backup capacitor
32 upper MOSFET
33 lower MOSFET
34 freewheeling MOSFET
35—
36 shunt
37—
38 Schottky diode
39 step-up MOSFET
40—
41 diode
42—
43 individual control
44—
45—
46 freewheeling Schottky diode

The invention claimed is:

1. A method for improving measurability of an end time of a mechanical switch-on operation of an electromagnetic actuator having an iron core displaceable by energizing an electrical coil via an electronic control circuit, the method comprising:
supplying the electronic control circuit with an operating voltage;
charging a capacitor arranged within the electronic control circuit; and
discharging the capacitor to increase a coil voltage during the mechanical switch-on operation to a value greater than the operating voltage; and
during the energization of the electrical coil:
a coil current rises in a current rise phase;
the current rise phase is followed by a peak current phase in which the coil current:
drops from a peak current phase initial value to a peak current phase intermediate value; and
rises from the peak current phase intermediate value to a peak current phase end value; and
the peak current phase is followed by a holding current phase in which the coil current drops to a holding current value range; and
the holding current phase is followed by a rundown current phase in which the coil drops from a rundown phase initial current value to zero.

2. The method according to claim 1, wherein the capacitor is charged to a capacitor voltage greater than the operating voltage.

3. The method of claim 1, wherein the value of the coil voltage during the mechanical switch-on operation is at least one and a half times greater than the operating voltage.

4. The method of claim 1, wherein the operating voltage is provided by a battery voltage.

5. The method of claim 1, wherein the mechanical switch-on operation begins with the current rise phase and extends to the peak current phase, the end time of the mechanical switch-on operation achieved when the peak current phase intermediate value is reached.

6. The method of claim 1, wherein the capacitor is charged at a start of the holding current phase while the coil current is dropping to the holding current value range, or the capacitor is charged at the start of the rundown current phase while the coil current is dropping to zero.

7. The method of claim 1, wherein the capacitor is charged when the actuator is mechanically switched off.

8. The method of claim 1, wherein the capacitor is charged by a charging current, and the capacitor is subsequently discharged by a discharging current, the charging current or the discharging current being pulse width-modulated.

9. The method of claim 1, wherein the electronic control circuit further comprises an upper MOF SET, a lower MOSFET, and a freewheeling MOSFET.

10. The method of claim 9, wherein the lower MOSFET is connected to ground via a shunt.

11. The method of claim 9, wherein the electronic control circuit further comprises a Schottky diode.

12. The method of claim 9, wherein the operating voltage is provided by a battery and the electronic control circuit further comprises a diode arranged in front of the battery.

13. A method for improving measurability of an end time of a mechanical switch-on operation of a plurality of electromagnetic actuators, each actuator having an iron core displaceable via an electronic control circuit, the method comprising:
  supplying the electronic control circuit with an operating voltage, the electronic control circuit having:
    one capacitor;
    one step-up MOSFET arranged in series with the one capacitor; and
    individual controls arranged for each of the plurality of electromagnetic actuators, each of the individual controls including:
      an upper MOSFET;
      an electrical coil;
      a lower MOSFET; and
      a shunt; and
  charging the one capacitor; and
  discharging the one capacitor to increase a coil voltage of each electrical coil during the mechanical switch-on operation to a value greater than the operating voltage.

14. The method of claim 13, wherein each of the individual controls further comprises a freewheeling MOSFET.

15. The method of claim 13, wherein each of the individual controls further comprises a freewheeling Schottky diode.

16. The method of claim 13, wherein each of the individual controls further comprises a Schottky diode configured to provide a charging current to the one capacitor.

17. A method for improving measurability of an end time of a mechanical switch-on operation of a plurality of electromagnetic actuators, each actuator having an iron core displaceable via an electronic control circuit, the method comprising:
  supplying the electronic control circuit with an operating voltage, the electronic control circuit having:
    one capacitor;
    one step-up MOSFET arranged in series with the one capacitor; and
    individual controls arranged for each of the plurality of electromagnetic actuators, each of the individual controls including an electrical coil and a Schottky diode configured to provide a charging current to the one capacitor;
  charging the one capacitor; and
  discharging the one capacitor to increase a coil voltage of each electrical coil during the mechanical switch-on operation to a value greater than the operating voltage.

* * * * *